United States Patent [19]

Benz et al.

[11] Patent Number: 5,134,040
[45] Date of Patent: Jul. 28, 1992

[54] MELT FORMED SUPERCONDUCTING JOINT BETWEEN SUPERCONDUCTING TAPES

[75] Inventors: Mark G. Benz, Burnt Hills; Bruce A. Knudsen, Amsterdam, both of N.Y.; Lee E. Rumaner, Seattle, Wash.; Robert J. Zabala, Schenectady, N.Y.

[73] Assignee: General Electric Company, Schenectady, N.Y.

[21] Appl. No.: 732,892

[22] Filed: Jul. 19, 1991

Related U.S. Application Data

[63] Continuation of Ser. No. 561,438, Aug. 1, 1990.

[51] Int. Cl.$^5$ .................. H01R 4/68; H01B 12/00
[52] U.S. Cl. .................. 428/646; 428/662; 428/930; 505/927
[58] Field of Search .................. 428/646, 930, 662; 505/927, 926, 915; 29/599

[56] References Cited

U.S. PATENT DOCUMENTS

| | | | |
|---|---|---|---|
| 3,416,917 | 12/1968 | DeSorbo | 75/174 |
| 3,429,032 | 2/1969 | Martin et al. | 29/599 |
| 3,449,818 | 6/1969 | Lowe | 505/927 |
| 3,473,217 | 10/1969 | Prior | 29/599 |
| 3,523,361 | 8/1970 | Kinter et al. | 29/599 |
| 3,527,876 | 9/1970 | Karvonen et al. | 505/927 |
| 3,895,432 | 7/1975 | Diepers et al. | 505/927 |
| 4,631,808 | 12/1986 | Jones | 505/926 |
| 4,673,774 | 6/1987 | Wake et al. | 29/599 |
| 4,713,878 | 12/1987 | Kumpitsch et al. | 174/125.1 |
| 4,744,506 | 5/1988 | Thornton | 225/179 |
| 4,794,688 | 1/1989 | Wada et al. | 29/599 |
| 4,894,906 | 1/1990 | Huang | 29/599 |
| 4,901,429 | 2/1990 | Srivastava | 29/599 |

FOREIGN PATENT DOCUMENTS

| | | |
|---|---|---|
| 1952148 | 8/1970 | Fed. Rep. of Germany ...... 505/927 |
| 1490637 | 10/1972 | Fed. Rep. of Germany . |
| 2-207471 | 8/1990 | Japan ...... 29/599 |
| 2-276180 | 11/1990 | Japan ...... 29/599 |
| WO/802084 | 10/1980 | PCT Int'l Appl. ...... 29/599 |
| 1254542 | 11/1971 | United Kingdom . |
| 1278086 | 6/1972 | United Kingdom . |
| 1298068 | 11/1972 | United Kingdom ...... 29/599 |
| 1322799 | 7/1973 | United Kingdom . |

OTHER PUBLICATIONS

D. N. Cornish et al., "Cold-Pressure-Welded Joints in large Multifilamentary N6-Ti Superconductors", Proceedings of the Seventh Symposium on Engineering Problems of Fusion Research, Knoxville, Tenn., USA, Oct. 25-28, 1977, pp. 1266-1269.

"Superconducting Joint Between Multifilamentary Wires", G. Luderer, P. Dulenkopf, G. Laukien, Cryogenics, Sep. 1974, pp. 518-519.

"Properties of Welded Joints Between Wires of Nb-Zr-Ti and Nb+Ti Alloys", I. S. Krainskii and I. F. Shchegolev, Cryogenics, Feb. 1973, pp. 106-107.

"How to Make High Critical Current Joints in Ni-Ti Wire", David G. Blair, Rev. Sci. Instrum., vol. 46, No. 8, Aug. 1975, pp. 1130-1131.

"Fabrication of Resistance Welded Joints in NbTi-Superconducting Wire", M. W. Brieko and L. Hoorn, Proceedings of the International Conference Joining of Metals, Aug. 9-12, 1981, Denmark, pp. 66-71.

(List continued on next page.)

Primary Examiner—John Zimmerman
Attorney, Agent, or Firm—James E. McGinness; James C. Davis, Jr.; James Magee, Jr.

[57] ABSTRACT

Superconducting tapes have an inner laminate comprised of a parent-metal layer selected from the group niobium, tantalum, technetium, and vanadium, a superconductive intermetallic compound layer on the parent-metal layer, and a reactive-metal layer that is capable of combining with the parent-metal and forming the superconductive intermetallic compound. A superconducting joint between contiguous tapes comprises, a continuous precipitate of the superconductive intermetallic compound fused to the tapes forming a continuous superconducting path between the tapes.

9 Claims, 2 Drawing Sheets

OTHER PUBLICATIONS

"Diffusion Welding Multifilament Superconductive Composites", Charles E. Witherell, Welding Journal, Jun. 1978.

"Joining NbTi Superconductors by Ultrasonic Welding", Hafstrom, et al. IEEE Transactions on Magnetics, vol. MAG-13, No. 1, Jan. 1977, pp. 94–96.

"Monolithic Terminations for Multistrand Nb-Ti and Nb3Sn Cables", S. J. Waldman and M. O. Hoenig, Advances in Cryogenic Engineering Materials, vol. 26, 1979, pp. 608–614.

"Experimental Test and Evaluation of the Nb3Sn Joint and Header Region for the Westinghouse LCP Coil", Blaugher, et al., IEEE Transactions on Magnetics, vol. MAG.-17, No. 1, Jan. 1981, pp. 467–469.

"Superconducting Properties of Diffusion Processed Niobium-Tin Tape", M. G. Benz, IEEE Transactions on Magnetics, vol. MAG.-2, No. 4, Dec. 1966, pp. 760–764.

"Enhancement of the Critical Current Density in Niobium-Tin", J. S. Caslaw, Cryogenics, Feb. 1971, vol. 11.

MELT FORMED SUPERCONDUCTING JOINT BETWEEN SUPERCONDUCTING TAPES

This application is a continuation of application Ser. No. 07/561,438, filed Aug. 1, 1990, pending.

Cross reference to related application, this application is related to copending application Ser. No. 07/561,439, filed Aug. 1, 1990 now U.S. Pat. No. 5,082,164.

BACKGROUND OF THE INVENTION

This invention relates to methods of joining superconducting tapes, and more specifically, to methods of forming a superconducting joint between superconducting tapes. As used herein, the term "tape" means an elongate body having major surfaces in the width and length dimensions, and a small dimension, i.e., the thickness.

Superconductivity is that characteristic of certain materials which permits them to conduct electric currents without resistance. A superconducting material exhibits this characteristic only when its temperature is below the superconducting critical temperature of the material and then only if it is not subject either to a magnetic field greater than the superconducting critical magnetic field of the material or to an electric current greater than the superconducting critical current of the material. Accordingly, superconductivity can be quenched, i.e., returned to a resistive state, by increasing the temperature, magnetic field, or current to which the superconducting element is subjected above the critical temperature, magnetic field, or current. Quenching of the superconductivity may occur abruptly or more gradually depending upon the particular material, i.e., the relative breadth of its superconducting transition state in terms of temperature, magnetic field, or current.

Superconductive bodies of laminated construction having an elongated tape o strip configuration and the methods of producing such superconductive tapes are well known. For example, British patent 1,254,542 incorporated by reference herein, discloses improved superconducting tapes, and methods of forming the improved tapes. U.S. Pat. No. 3,537,827, incorporated by reference herein, discloses improvements in laminating superconducting tapes and methods for producing the laminated tapes.

Briefly stated, it is known that selected parent-metals, either pure or preferably containing minor alloying additions, are capable of being reacted with other metals and forming superconducting compounds or alloys that have a high current-carrying capacity. Parent-metals niobium, tantalum, technetium, and vanadium can be reacted or alloyed with reactive-metals tin, aluminum, silicon, and gallium to form superconducting alloys, such as triniobium tin. As used herein, the term "triniobium tin" is a superconducting alloy in the form of an intermetallic compound comprised of three niobium atoms per tin atom.

Additionally, it is understood that the superconductive alloys or compounds can be improved by first alloying the parent-metal, i.e., niobium, tantalum, technetium, and vanadium with a minor amount of a solute metal having an atom diameter of at least 0.29 angstrom larger than the diameter of the parent-metal atom. A broad disclosure of various parent-metals, solute metals, and reactive-metals can be found in U.S. Pat. No. 3,416,917. U.S. Pat. No. 3,429,032 discloses improved critical currents in triniobium tin superconducting alloy formed when niobium containing zirconium up to about 25 percent is heated in the presence of excess tin, and a non-metal selected from the group consisting of oxygen, nitrogen, and carbon.

It is also known that the reactive-metals can be alloyed to improve the superconductive tape. For example, the critical current density of triniobium tin has been improved by making copper additions in the reactive-metal tin for coating on niobium tape as disclosed in, "Enhancement of the Critical Current Density in Niobium-Tin" J. S. Caslaw, Cryogenics, Feb. 1971, pp. 57–59. As used herein, the term "reactive-metals" includes the alloys of the metals tin, aluminum, silicon, and gallium that react with parent-metals to provide superconductive alloys, for example, a tin alloy comprised of up to 45 weight percent copper.

It has been found that niobium is an important parent-metal due to the superior superconducting alloys which it will form. For example, small percentages generally greater than one-tenth weight percent of a solute metal can be added to the niobium parent-metal to effectively increase its current-carrying capacity. Zirconium additions are felt to be those most advantageous. The solute materials, for example, zirconium, are added in amounts up to about 33 atomic percent. Other solute additives are used in similar amounts.

The solute-bearing niobium is reacted with either tin, aluminum, or alloys thereof by contacting the niobium with either of these metals or alloys, and then heating them to an elevated temperature for a time sufficient to cause suitable reaction to occur. Especially advantageous materials are those of the niobium-tin compositions in which the ratio of niobium to tin approximates three to one, i.e., triniobium tin, since these materials have superior superconducting properties.

The triniobium tin alloy has been fabricated in various forms, particularly wires and tapes, in efforts to produce devices such as high field superconducting electromagnets. One method for obtaining superconducting tape in a continuous fashion is that wherein a tape of a preselected parent-metal, such as niobium or niobium alloy, is continuously led through a bath of molten reactive-metal such as tin or tin alloy. The tape picks up a thin coating of the reactive-metal from the molten bath and the tape is subsequently heated in a reaction furnace to cause formation of a superconductive alloy on the surface of the parent-metal tape.

The superconducting alloy formed on the tape is fragile, and outer laminae of non-superconductive metal are applied to the tape to make a laminated superconductor that is strong and capable of being wound onto coils without damage to the superconductive material. For example, a relatively thin tape of niobium foil is treated with tin to form an adherent layer of triniobium tin on the surfaces of the tape, and copper tapes of substantially the same width are soft soldered to each of the major surfaces of the superconductive tape to form a symmetrically laminated structure. Because of the difference in the coefficient of thermal expansion of copper and the niobium-niobium tin material, the brittle intermetallic compound is placed in compression even at room temperature, minimizing the danger of mechanical fracture when coiling.

One use for such superconductive tape is for the windings in superconducting magnets. For example, a magnetic resonance imaging device can use 6 superconducting magnets, with the windings in each magnet requiring a continuous length of superconducting tape of over a kilometer. Individual magnets in the device are connected together to provide a continuous superconducting path through all six magnets. As a result, a continuous length of superconducting tape of many kilometers would be required for the device. Continuous lengths of many kilometers of superconductive tape are not currently available, and many shorter lengths would have to be joined. In addition, it can be expected that some breakage and damage of the tapes will occur during tape winding operations, necessitating joints to repair such breakage or damage.

Superconducting magnets are often used in apparatus requiring a constant magnetic field from the magnet. To maintain the constant magnetic field the magnet must operate in the superconducting, or persistent mode. Current loss in the magnet from internal resistance causes drift or reduction of the magnetic field. As a result, a superconducting joint is desirable for making the necessary connections between superconducting tapes to prevent drift of the magnetic field. The current-carrying capacity and magnetic field behavior of the joints should at least approach the current-carrying capacity and magnetic field behavior of the superconducting tape, or the joints will become the limiting factor in the current-carrying capacity of the device.

An object of this invention is a method for forming superconducting joints between superconducting tapes where the joints have a high current-carrying capacity, approaching the current-carrying capacity of the superconducting tape.

Another object of the invention is a method for forming superconducting joints between superconducting tapes where the joints sustain the superconductive properties in high magnetic fields approaching the high field behavior of the superconductive tape.

BRIEF DESCRIPTION OF THE INVENTION

We have discovered a method for joining superconducting tapes to form a joint having a high critical current capability, and high magnetic field behavior, approaching the critical current and high field behavior of the adjoining superconducting tape. Superconducting tapes joined by the method of this invention have an inner laminate comprised of a parent-metal layer, at least one superconductive alloy layer on the parent-metal layer, and at least one reactive-metal layer that is capable of combining with the parent-metal and forming the superconductive alloy. An outer laminate of a non-superconductive metal having a coefficient of thermal expansion greater than that of the inner laminate, is bonded to both sides of the inner laminate. An insulator such as varnish is sometimes used to cover the outer laminate on some tapes. The parent-metal is a metal selected from the group niobium, tantalum, technetium, and vanadium.

When insulating layers are present on the superconducting tape, the insulating layers are removed from a section of each tape, herein referred to as the exposed section. The exposed sections are the sections in the tapes that are joined in the method of this invention. The outer laminate is removed from the exposed sections, and the tapes are positioned so that the exposed sections are in contact. Preferably, the exposed sections are soldered together and clamped between chill plates. The chill plates cover the exposed sections except for an intended melt zone or zones. The chill plates are made from a thermally conductive metal such as copper to conduct heat away from the melt zone. As used herein, the term "melt zone" means a preselected zone or zones within the exposed sections where the exposed sections are in contact, and are to be melted.

A preselected melt zone in the exposed sections is melted and resolidifies to at least form a continuous precipitate layer of the superconductive alloy connecting both tapes. The melt zone is at least large enough to provide sufficient parent-metal, superconductive alloy, and reactive-metal to form a melt that resolidifies as a continuous precipitate of the superconductive alloy. A continuous layer of superconductive alloy is precipitated that is continuous with the superconductive alloy on the superconducting tape, providing a continuous superconducting current path between tapes. Preferably, sections of the outer laminate material corresponding to the size of the exposed sections are bonded to the outermost surfaces of the joined exposed sections, for example, by soldering.

DETAILED DESCRIPTION OF THE INVENTION

Figure 1:
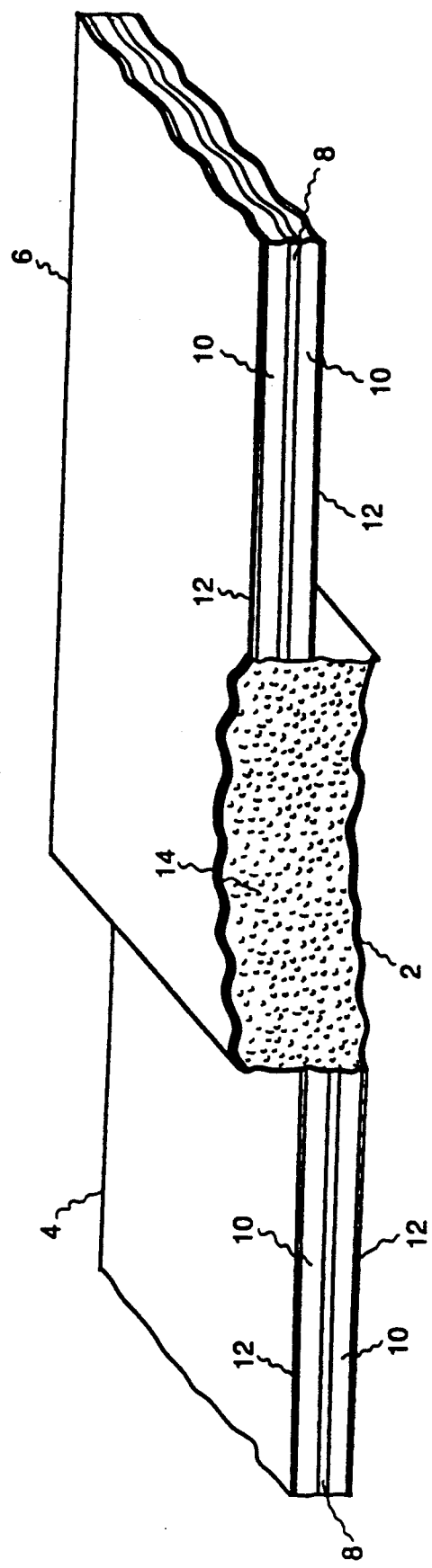
FIG. 1 is a perspective view of a superconducting joint of this invention.

Superconducting tapes are joined by the method of this invention to form a superconducting joint. Such superconducting joints can be used to repair superconducting tapes that are broken during winding or handling, to join short lengths of tape to form a long length of tape needed to form the winding in a large superconducting magnet, or to join separate magnets in a series. When the joints are part of a superconducting magnet, the superconducting properties of the joints will limit the current-carrying capacity in the magnet, and as a result, limit the magnetic field that can be generated by the magnet. Therefore, the joints should have a high current-carrying capability and a high magnetic field behavior approaching the current-carrying capability and magnetic field behavior of the superconducting tape.

In one embodiment of the present invention, a superconducting tape is joined having triniobium tin as the superconductive alloy in the tape, and is herein referred to as "triniobium tin tape." Triniobium tin tapes are well known in the art being described, for example, in "Superconducting Properties of Diffusion Processed Niobium-Tin Tape," M. Benz, I.E.E.E. Transactions of Magnetics, Vol. MAG-2, No. 4, Dec. 1966, pp. 760–764. Briefly described, a typical example of a triniobium tin superconducting tape has a width of about 5 mm, and a thickness of about 185 microns. The tape has an inner laminate of about 33 microns, comprised of a parent-metal layer of niobium alloy of about 11 microns, superconductive alloy layers of triniobium tin of about 8 microns on both surfaces of the niobium alloy layer, reactive-metal layers of excess tin alloy of about 3 microns on the superconductive alloy layers, and an outer laminate of copper of about 76 microns soldered to the inner laminate. Optionally, a varnish coating covers the outer laminate on both sides. The varnish is comprised of a mixture of equal parts toluol and menthanol mixed 4 parts to 1 with G.E. 7031 Insulating Varnish.

The outer laminate is soldered to the inner laminate with a solder comprised of about 37 weight percent lead and the balance tin. Optionally, the outermost surface of the copper laminate is coated with solder to provide additional corrosion resistance for the tape. The parent-metal is a niobium alloy comprised of up to about 5 atomic percent zirconium, up to about 10 atomic percent oxygen, and the balance niobium. The reactive-metal is comprised of up to about 40 atomic percent copper with the balance substantially tin. Preferably, the parent-metal is a niobium alloy comprised of about 1 atomic percent zirconium, about 2 atomic percent oxygen, and the balance niobium; and the reactive-metal is comprised of about 32 atomic percent copper with the balance substantially tin.

Triniobium tin tapes that are to be joined have the varnish insulation, solder coating, and copper outer laminate removed from both surfaces of the tapes to form exposed sections. The varnish, solder, and copper laminate can be removed by conventional means well known in the art. For example, the varnish insulation can be removed with acetone, while the solder and copper laminate can be removed with etchants. A suitable etchant for removing the solder is comprised of ammonium bifluoride, hydrogen peroxide, and water, and is available from Cutech Inc., Pa., as Cutech solder stripper SNPB 1117. Solder can be removed by dipping the intended exposed section in the solder stripper for about 30 seconds. A suitable etchant for the copper outer laminate is comprised of 179.7 grams sodium peroxodisulfate, 0.009 grams mercury(II) chloride, and 7.5 milliliters phosphoric acid. The copper etchant is heated to about 50° C. and the intended exposed section is dipped in the etchant for about 45 minutes to remove the outer laminate.

Alternatively, the copper outer laminate can be removed by delamination from the tape, and can be reapplied to the exposed sections after joining. For example, a soldering iron is applied to the outer laminate to soften the solder in the area of the exposed section. The copper laminate is then peeled away from the exposed section, and held in a position away from the exposed section by known positioning or clamping means during the joining process. The delaminated sections of the outer laminate can also be cut off and later reapplied to the outermost surface of the joined exposed sections.

The superconducting tapes are positioned so that the exposed sections are in contact. It is within the area of contact between the tapes that the joint is formed in the melt zone. For example the tapes can be positioned to be in the same plane, aligned in the length dimension and in abutting contact along the leading edge of the exposed sections. The leading edges of the exposed sections are formed to be in oppositely matching relation to form what is well known in the art as a butt joint, with the intended melt zone encompassing the abutting leading edges. Preferably, the superconducting tape is protected by chill plates clamped over the exposed sections, leaving the melt zone exposed.

With respect to positioning of the tapes, preferably, the exposed sections are overlapping so that the tapes are symmetrical in the width dimension. The tapes are then soldered together to provide strength to the joint during and after joining. The intended melt zone is along at least one of the aligned edges in the width dimension of the exposed sections. In the most preferred method the melt zone is along one of the edges in the width dimension of the overlapping exposed sections.

Copper chill plates, about the width of the superconducting tape and several times the length of the melt zone, have a notch of predetermined length and depth corresponding to the size of the melt zone removed from the central portion of the plate, along one edge in the width dimension. The notch in the copper plates defines the limits of the intended melt zone. The copper plates are then clamped over the exposed sections so that the notched portions of the copper plates are symmetrically aligned, leaving only the intended melt zone exposed. The chill plates hold the superconducting tapes together and rapidly remove any excess heat during the melting operation that follows. The copper chill plates can be formed in any size or shape that rapidly removes heat from the melt zone.

The melt zone is heated in a protective atmosphere to a temperature that melts the superconducting tape, without vaporizing any of the constituents of the tape. As used herein, the term "protective atmosphere" means an atmosphere that does not provide hydrogen or oxygen for reaction, corrosion, or embrittlement of the tape. For example, apparatus used for tungsten inert gas welding, laser beam welding, or electron beam welding can be controlled to melt the superconducting tape in a protective atmosphere, without vaporizing the constituents of the tape.

We have discovered that a superconducting tape, such as triniobium tin, can be melted in a melt zone and resolidified to form a continuous precipitate of superconductive alloy that is continuous with the superconductive alloy on the tape adjacent the melt zone. The resolidified melt zone is sometimes herein referred to as the "weld bead." Prior to this, it was known that superconductive alloys could be formed by heating parent-metals in the presence of reactive-metals to temperatures that cause melting of the reactive-metal and reaction with the parent-metal, forming the superconductive alloy by a diffusion reaction. It had not been known, and it is considered very surprising that a parent-metal, a superconductive alloy, and excess reactive-metal can be melted together and resolidified to form a continuous precipitate of superconductive alloy that is continuous with the parent superconductive alloy on a superconducting tape.

The size of the melt zone and resulting weld bead determines the current-carrying capacity of the joint. Generally, it has been found that the current-carrying capacity of the weld bead is about 10 times less than the current-carrying capacity of the superconductive alloy on the tape. Therefore, to approach the current-carrying capacity in the superconducting tape, the superconducting cross-section of the weld bead has to be 10 times greater than the superconducting cross-section of the tape. The superconducting cross-section is determined by means well known in the art, and is the width times the thickness of the continuous portion of the superconducting alloy. For example, in the most preferred joint along one edge of the exposed sections, a preferred melt zone is at least 15 millimeters, and preferably 20 millimeters, long and 0.5 millimeters wide for a 3 millimeter wide triniobium tin tape.

The melt zone reduces the cross-section of the tape and, therefore, reduces the superconducting cross-section available in the tape. The current-carrying capacity of the tape in the joint area can be reduced below the current-carrying capacity of the tape if the melt zone is not selected carefully. In the initial superconducting cross-section of the joint, prior to where any current is transferred through the joint, the loss of superconducting cross-section becomes a limiting region in the tape. As a small amount of current transfers through the weld bead, the joint is no longer limited in cross-section, having nearly twice as much conductor as the original tape. It is, therefore, important to form a weld bead in the beginning of the joint which minimizes the loss of superconducting cross-section in the parent tape.

For example, loss of superconductive cross-section in the tape can be minimized by adding additional material to the melt zone. A piece of superconducting tape having the outer laminate removed is positioned over the melt zone and melted with the melt zone. The additional material adds superconducting cross-section to the weld bead without sacrifying the width of the superconducting tape. Another method is to form the weld bead so that it tapers out to the edge of the superconducting tape.

A preferred melt zone in the above described butt joint is diagonal across the width of the exposed sections so that the weld bead is formed diagonally across the width of the tape. This allows the current to transfer from one tape to the other at various points across the width of the tape. If the current must transfer at a single point across the width, then the superconducting cross-section at this point will be critical, and must be at least the superconducting cross-section in the adjoining tapes.

The exposed sections in the superconducting tapes are at least longer than the melt zone, and preferably are long enough to provide for ease of joint formation. After joining, a section of outer laminate corresponding to the size of the exposed section is soldered to cover the exposed section.

Figure 2:
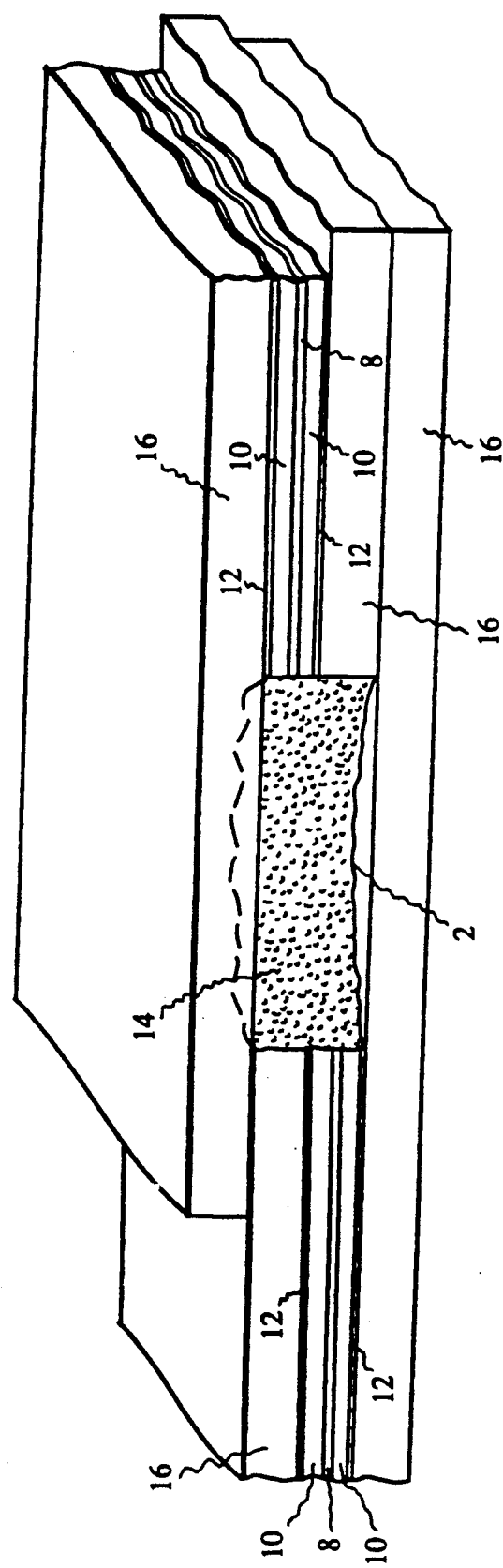
FIG. 2 is a perspective view of the superconducting joint in FIG. 1 having a non-superconductive outer laminate bonded to cover the joint.

Referring to FIG. 1, a superconducting joint 2 is shown between superconducting tapes 4 and 6. Superconducting tapes 4 and 6 are comprised of an inner laminate having a parent-metal layer 8, a superconductive intermetallic compound layer 10, and a reactive-metal layer 12. Joint 14 is a continuous precipitate of the superconductive intermetallic compound fused to the tapes, and forms a continuous superconducting path between the tapes. Referring to FIG. 2, a non-superconducting metal outer laminate 16 can be bonded to the tapes 4 and 6, for example by soldering, to cover the joint 14. It should be understood that FIGS. 1 and 2 are magnified views not drawn to scale, and the dimensions of the joint, inner laminate layers, and superconducting tape can vary from that shown in FIGS. 1 and 2.

EXAMPLE I

A reel of triniobium tin tape approximately 3 mm in width was obtained. Five pairs of sample lengths of the tape, about 25 cm in length, were removed from the reel for joining by the method of this invention. Solder on the outermost surfaces of each tape was removed by dipping about 5 cm of one end of each tape in the Cutech solder stripper SNPB 1117, described above, for about 60 seconds. The same end sections of each tape were then dipped for about 45 minutes in the above described copper stripping solution heated to about 50° C. This removed the copper outer laminate and exposed the thin layer of solder that had bonded the outer laminate to the inner laminate forming exposed sections for joining. About 1 cm was trimmed from the exposed sections, leaving exposed sections of about 4 cm in length.

About 12 mm of the exposed sections in each pair of sample lengths were overlapped so that they were symmetrically aligned in the width dimension. The overlapping exposed sections were then soldered together by heating with a soldering iron. No extra solder was added because the thin layer of solder remaining on the exposed sections was sufficient to bond the exposed sections together.

Copper chill plates about $25 \times 76 \times 3.2$ mm had a notch removed from the mid-length of the plate along one edge of each plate. The notch was about 10 mm long and about 0.5 mm in depth with a taper at each end of the notch. The copper chill plates were clamped on both sides of the exposed sections so that the notches in the plates were symmetrically aligned over the overlapping exposed sections, leaving a portion of one edge exposed where the plates had been notched. This exposed area within the notch portion of the chill plates is the intended melt zone in the exposed sections.

A tungsten inert gas arc welder was used to melt the melt zone. The tungsten electrode had a tip size of about 0.5 mm in diameter, and argon was used as the shielding gas. An arc was drawn by touching the electrode to the chill plate. The arc was moved from the chill plate onto the foil with a slow motion until some melting of the exposed section occurred. After the initial melting, the arc was moved across the melt zone in several slow sweeps until the entire melt zone was melted. After complete melting was achieved, the electrode was removed and a weld bead formed along the melt zone.

The joint was then tested to determine the current-carrying capability of the joint using the four probe resistance measurement technique well known in the art. Two voltage probes were soldered onto the superconducting tape a short distance from each side of the joint. Current leads were soldered onto the superconducting tape at a further distance from each side of the joint. The joints were cooled to 4.2K by cooling in liquid nitrogen, followed by cooling in liquid helium. A magnet having a magnetic field of about 5 Tesla was aligned over the joint so that the magnetic field was perpendicular to the current path in the superconducting tape.

A current was passed through the joint in increasing steps, and the voltage was recorded from the probes on each side of the joint. In this test, the critical current was defined as the current which caused a voltage differential of 0.2 microvolts between the probes. Three sections of triniobium tin tape that did not contain joints were similarly tested to determine the critical current of the triniobium tin tape. The critical currents measured on the tape samples and joints are shown below in Table I.

TABLE I

| Clinical Current Measured at 4.2K and 5 Tesla | |
|---|---|
| Sample | Critical Current (Amps) |
| Tape 1 | 304 |
| Tape 2 | 351 |
| Tape 3 | 362 |
| Joint 1 | 165 |
| Joint 2 | 277 |
| Joint 3 | 262 |
| Joint 4 | 208 |
| Joint 5 | 270 |

The critical current measured in the joints made in Example 1 is at least 50 percent of the critical current in the superconducting triniobium tin tape. Therefore, a joint having a melt zone of about 20 mm in length, about twice the length of the melt zones for the joints made in Example 1, should be sufficient to provide a superconducting joint with the current-carrying capacity of the 3 mm wide triniobium tin tape.

The critical current test also showed that joints formed by the method of this invention are superconducting in a magnetic field of 5 Tesla. A magnetic field of 5 Tesla is above the critical field of niobium, tin, and any other part of the joint except triniobium tin. Therefore, a continuous triniobium tin current path existed through the joint in order for the joint to be superconducting in the 5 Tesla magnetic field.

What is claimed is:

1. A superconducting joint between contiguous superconducting tapes having an inner laminate comprised of a parent-metal layer selected from the group niobium, tantalum, technetium, and vanadium, a superconductive intermetallic compound layer on the parent-metal layer, a reactive-metal layer that is capable of combining with the parent-metal and forming the superconductive intermetallic compound, the joint comprising: a continuous precipitate of the superconductive intermetallic compound fused to the tapes forming a continuous superconducting path between the tapes.

2. The superconducting joint of claim 1 further comprised of an outer laminate of a non-superconductive metal bonded to cover the joint.

3. The superconducting joint of claim 1 wherein the tapes are overlapping and symmetrically aligned in the width dimension, and the precipitate is fused at an edge in the width dimension of the tapes.

4. The superconducting joint of claim 1 wherein the tapes are coplanar and aligned to form a butt joint, and the precipitate is fused where the tapes are contiguous.

5. A superconducting joint between contiguous superconducting tapes having an inner laminate comprised of a niobium layer, a superconductive triniobium tin layer on the niobium layer, and a tin layer on the triniobium tin layer, comprising: a continuous precipitate of the triniobium tin fused to the tapes forming a continuous superconducting path between the tapes.

6. The superconducting joint of claim 5 further comprised of an outer laminate of a non-superconductive metal bonded to cover the joint.

7. The superconducting joint of claim 5 wherein the tapes are overlapping and symmetrically aligned in the width dimension, and the precipitate is fused at an edge in the width dimension of the tapes.

8. The superconducting joint of claim 5 wherein the tapes are coplanar and aligned to form a butt joint, and the precipitate is fused where the tapes are contiguous.

9. The superconducting joint of claim 5 wherein the parent-metal layer is comprised of up to about 5 atomic percent zirconium, up to about 10 atomic percent oxygen, and the balance niobium, and the reactive-metal layer is comprised of up to about 40 atomic percent copper and the balance tin.

* * * * *